United States Patent [19]
Kelem et al.

[11] Patent Number: 5,422,833
[45] Date of Patent: Jun. 6, 1995

[54] METHOD AND SYSTEM FOR PROPAGATING DATA TYPE FOR CIRCUIT DESIGN FROM A HIGH LEVEL BLOCK DIAGRAM

[75] Inventors: Steven H. Kelem, Los Altos Hills; Steven K. Knapp, Santa Clara, both of Calif.

[73] Assignee: Xilinx, Inc., San Jose, Calif.

[21] Appl. No.: 785,664

[22] Filed: Oct. 30, 1991

[51] Int. Cl.$^6$ ............................................. G06F 15/60
[52] U.S. Cl. .................................... 364/578; 364/489
[58] Field of Search .............. 364/488, 489, 490, 578, 364/716; 371/22.2, 22.3, 22.5; 307/465; 340/825.83, 825.87; 361/392, 393

[56] References Cited

U.S. PATENT DOCUMENTS

| | | | |
|---|---|---|---|
| 3,579,119 | 5/1971 | Yau et al. | 307/465 |
| 3,731,073 | 5/1973 | Moylan | 364/716 |
| 4,380,811 | 4/1983 | Götze et al. | 371/22.2 |
| 4,399,516 | 8/1983 | Blahut et al. | 364/716 |
| 4,503,537 | 3/1985 | McAnney | 371/22.3 |
| 4,513,418 | 5/1985 | Bardell, Jr. et al. | 371/22.3 |
| 4,764,926 | 8/1988 | Knight et al. | 371/22.5 |
| 4,817,093 | 3/1989 | Jacobs et al. | 371/22.3 |
| 5,109,353 | 4/1992 | Sample et al. | 364/578 |
| 5,128,871 | 7/1992 | Schmitz | 364/489 |
| 5,159,599 | 10/1992 | Steele et al. | 371/22.2 |
| 5,164,911 | 11/1992 | Jurau et al. | 364/488 |
| 5,189,628 | 2/1993 | Olsen et al. | 364/489 |
| 5,200,580 | 3/1993 | Sienski | 361/392 |

OTHER PUBLICATIONS

Kelem et al.; "Shortening the Design Cycle for Programmable Logic Devices"; IEEE Design & Test of Computers; Dec. 1992.

*Primary Examiner*—Ellis B. Ramirez
*Attorney, Agent, or Firm*—Jeanette S. Harms; Norman R. Klivans; Edel M. Young

[57] ABSTRACT

A computer aided design system for electronic digital circuitry allows the circuit designer to design a circuit using high level block components, The designer specifies data type and precision (bus width) parameters as desired for whichever circuit blocks and/or busses he desires, Then the system propagates the data types and precision throughout the design automatically to achieve circuit-wide consistency, The system can also be used to verify a circuit design for data type and bus width consistency, The system can also be used to determine the mode of operation for the circuit blocks in the circuit.

18 Claims, 6 Drawing Sheets

METHOD AND SYSTEM FOR PROPAGATING DATA TYPE FOR CIRCUIT DESIGN FROM A HIGH LEVEL BLOCK DIAGRAM

FIELD OF THE INVENTION

The invention relates to computer-aided engineering, and more particularly to specification of information about a circuit design for simulating and verifying the design or implementing the design in a digital logic circuit.

BACKGROUND OF THE INVENTION

Schematic capture is a well known process in computer aided engineering for converting a schematic drawing generated by a designer into a format which can be processed by a computer. Commercially available schematic capture software packages allow a designer to communicate the design to a computer without having to enter the design in a form cumbersome for the designer but readable by the computer. A schematic capture package typically converts the interconnected set of functional components to a net list (a list of components and interconnections between these components) which can be further manipulated by other computer programs to perform a design function desired by a designer.

One function for which schematic capture can be used is to program a field programmable logic array chip to perform the logic or arithmetic task indicated by the design. Another function is to simulate or verify the design and test it to determine whether the design will perform as the designer intended. Other functions are the synthesis of new design implementations from the original circuit design.

Typical schematic capture packages have included a library of primitive components, such as Boolean AND, XOR, flipflop, etc., which the designer may place onto a schematic diagram presented on a computer display and interconnect with lines to form a logic design. However, designers frequently think in terms of higher level logic/arithmetic functions to be performed, for example counters, adders, registers and multiplexers. Entering a design directly in terms of the higher level logic operations which the design is to perform is more convenient and intuitive for a designer than is entering the logic design in terms of primitive AND, flipflop gates, etc.

Data Type

Certain high level arithmetic functional components such as adder, register, and counter are frequently used. Related patent application Ser. No. 07/785,659, filed concurrently with the present application, entitled Generating Logic Modules for a High Level Digital Circuit Design, describes a method for implementing certain high level functional components directly input by a designer in a digital logic circuit without involving the intermediate step of generating primitive schematic diagrams. These high level functions typically operate on values of more than one digit, and the values are typically passed on buses. The bus width is preferably selected by the designer, in which case the bus width must be specified by the designer when entering the schematic design using high level components. Further, digital circuit designers use several data type conventions for performing computer math, for example analog, unsigned binary, signed binary, and 2's complement. A string of 1's and 0's has a different meaning for a 2's complement data type than for an unsigned binary data type. There are also non-arithmetic data types for representing characters and graphical images, for example. If data are generated in one part of a logic design in one data type and fed to another portion the logic design which expects and processes the data as another data type, an error will result or the data will be misinterpreted. Thus data types must be consistent or at least compatible.

Further, a bus for transferring data from one part of a computer to another or from one part of a single chip to another may be of a different width than another bus. (Here the word "bus" means a single line as well as a group of lines.) When a field programmable gate array chip is configured to perform an arithmetic function, the width of the bus must be specified by the software which configures the chip, and the width of a bus which will carry the output of a numeric calculation must be sufficient to carry the full precision of the number. For example, a bus which receives the sum output of a 16-bit adder must be 16 bits wide.

In general, it is important that the data types and bus widths be consistent or at least compatible throughout the design.

Prior art methods for programming a logic design into a chip which will implement the design have not included means for checking the data type for consistency. Designers who fail to design with consistency thus risk incurring errors in the design and may have to correct the design before it functions properly to achieve the desired result.

The only prior art methods for checking data type are those which distinguish between a single conductive line and a multi-line bus and check that the width of (number of conductors in) a bus are consistent—but not that the processing units are consistent in terms of data type. Those that do check have required the designer to enter data type at every node of the design, making the process extremely cumbersome.

SUMMARY OF THE INVENTION

According to the present invention, a method is provided for entering the data type on one or more of each of the circuit module interface ports and buses, propagating the data type from a circuit node where it is entered by a designer to all other appropriate points in the circuit design where consistency is required according to characteristics of the functional circuit elements (modules) and busses in the logic design, and for checking consistency and completeness of data type entered by a designer and for specifying the style of operation of the functional elements specified by the designer in the logic design.

The invention makes it easy for a designer to specify parameters of the design and to avoid errors of data type consistency in entering the design and to change or revise a circuit design created according to these methods.

Module Master Templates

In order to check for consistency and to propagate data type information to other points of the design, the method provides a module "master template" for each function which can be specified by the designer. A master template is a set of rules and equations for each function. It specifies how a known data type on one port on an instance of that function translates to a data type on a second port of that function.

To specify the circuit design, which may be used for example to configure a logic array chip, the designer specifies functional components (modules) from the library of allowed functional components, and specifies how they are interconnected. "Components" here includes modules, and also more primitive circuit elements, but not buses. Then, at convenient locations in the logic design, the designer specifies the bus or functional component widths and the data types to be used.

In response, a computer program which receives the information applies to the functional components those rules which are stored as part of the associated master template. These rules:

1. translate and propagate designer-specified bus widths and data types to appropriate input/output ports on functional circuit components according to the master template rules,
2. check whether the data type specified by the designer for a port of a functional component is allowable on or compatible with that port of that master template,
3. propagate information specified about one port of the functional component to other ports of the functional component, according to the master template rules,
4. propagate information about the functional component ports onto buses attached to the functional component ports, and
5. propagate information from buses onto ports of the functional component.

The data type information continues to propagate through the circuit design according to the rules specified in the master templates until no further propagation can occur. The direction of the flow of data type information through the circuit design is independent of the flow of data through the circuit design. The data types are checked for consistency and completeness. If data types are incomplete (i.e., more information on data types are needed) or inconsistent, an error message is generated for the designer, who then corrects or completes the data. When no errors are present, the data types may be used to generate logic modules according to related patent application Ser. No. 07/785,659. The generated modules are then used to configure a logic array chip to perform the specified function, to simulate the function, or in other ways to obtain a physical circuit. For instance, the data type propagation method could be used to specify a circuit design for an ASIC (application specific integrated circuit) or a custom integrated circuit design for subsequent fabrication.

The rules of the master template of a functional component are specific for each functional module. For example, if the designer specifies an adder module whose output is stored in a register and specifies that the A input to the adder is unsigned binary arithmetic with a precision of 16 bits, the master template for the adder module will propagate the unsigned binary, precision 16 data type of the A input port to the B input port and to the sum port, thereby specifying that these ports will all handle unsigned binary numbers, will specify that the carry output will be an unsigned binary digit, will specify that a binary digit will be output from the carry output port, and will specify that 16-bit buses will connect to the A, B, and sum ports. Further, the master template for a register will propagate the derived data type of the bus connecting the adder and the register to the register input and output ports (without the designer having to specify the data type or bus width for the register), thereby inferring that the register will handle unsigned binary data, and that the output of the register will be unsigned binary data carried on a 16-bit bus. If the designer has also specified the data type of the register output bus, the program will check that the data type and precision specified by the designer agrees with the data type and precision propagated from the adder input.

Take another example, a multiplexer. When a field programmable gate array chip is configured to multiplex several numbers, the number of select bits for controlling the multiplexer must be sufficient to select from the plurality of input bits provided. (As is well known, the formula for the relationship between input bits and select bits is $i \leq 2^s$ where i is the number of input bits and s is the number of select bits assuming an unsigned binary encoding of the select port.) If both the number of input bits and the precision of the select port are specified by the designer, the method will check to see that these numbers are consistent. If the designer specifies the number of input bits, the precision of the select port will be calculated. If the designer specifies the precision of the select port, a range of inputs bits will be calculated, and an exact number of input bits will have to be provided by the designer or propagated from another part of the circuit design.

Thus the method allows a designer to input with minimum manual effort a design which is internally consistent as to data types. Further, if the designer wishes to revise an earlier entry, for example to change the data type or its precision for a bus, it is possible to make this change by changing only a single parameter on a bus or functional component. The software again checks and propagates the designer's new input so that it may be used to reconfigure the chip with the new bus data type and precision.

It is to be understood that the method in accordance with the invention is applicable to all digital circuit design (and by extension to analog circuit design) including all integrated circuits and higher level circuits including circuits composed of a plurality of integrated circuits.

DETAILED DESCRIPTION OF A PREFERRED EMBODIMENT

The data type propagation method and system of the present invention is especially useful when designing electronic digital circuitry with high level logic functional components.

Figure 1:
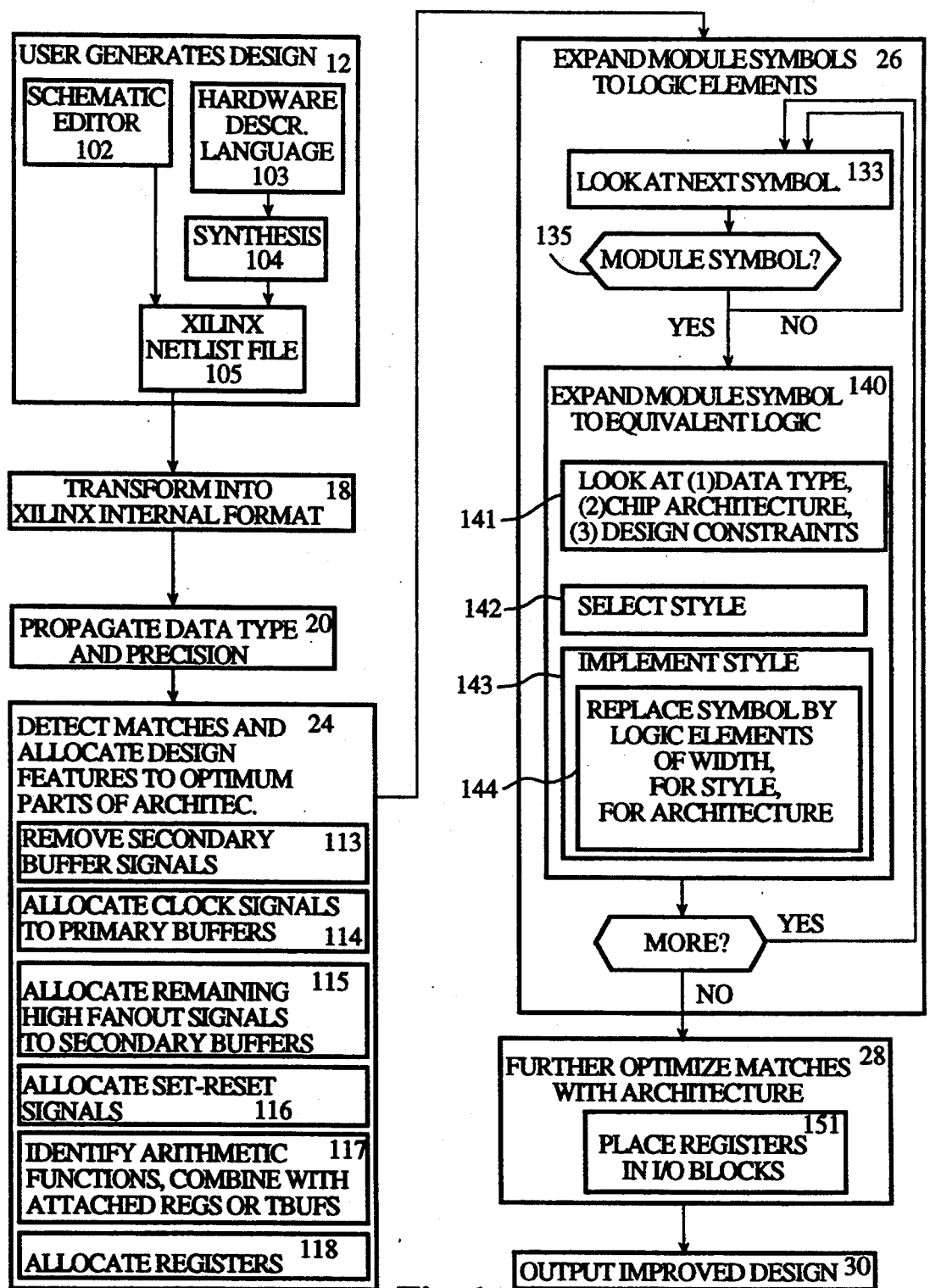
FIG. 1 shows a block diagram of a module generation system of which the data type propagation method of the present invention is a part.

As shown in FIG. 1, in the system at step 12 a designer generates a logic diagram using a schematic editor such as FutureNet, Cadence, VIEWlogic, OrCAD, or Mentor (102) or by the translation from a textual or other graphical language (103). A schematic editor allows the designer to represent the logic design in symbols on a computer monitor screen, and to draw lines between functional components to indicate the interconnections between the functional components. The logic design is read into the editor at step 102. If a particular functional component is supported by a module master template (drawn from a library of such templates) which tells subsequent software how to implement that functional component in the hardware, the designer may represent that functional component by a simple block in the schematic diagram. Functional components may also be represented by the designer in the schematic diagram by primitive Boolean functions. During the process in step 102 or 103 of generating the logic diagram, the designer enters data specifying data type and precision at any desired points on the circuit schematic.

After the designer has completed the design, the schematic editor or synthesis program (104) generates an output file at step 105 in a netlist format which can be used to analyze the logic design, simulate the circuit, create a custom chip, or program a programmable device to implement the design. In the present embodiment, the output file is intended for programming a commercially available Xilinx field programmable gate array chip and is called a Xilinx netlist file or XNF file.

Thus included in the input provided to the schematic editor (FutureNet, Cadence, etc., by the designer) or hardware description language in addition to logic symbols and interconnect lines, according to the present invention, is information specifying data type and precision. Step 18 converts the net list format into a format that makes it easier to perform the data type propagation method and the following steps.

Data-Type and Width Propagation Save Labor

As an important feature of the present invention, the designer need not provide information on data type and precision for every bus and component in the logic design, because at the next step 20, propagate data type and precision, the data type and bus width provided by the designer at perhaps one or a few places in the logic design in step 12 are propagated to other points in the logic design according to the rules provided in the module master templates of those modules indicated by the designer. This data type propagation serves three purposes: to check data types for consistency or compatibility throughout the design, to save the designer considerable effort in providing the necessary information to complete the logic design, and because data types need to be specified in only a few places, to allow changes in data type to be performed quickly and efficiently.

After the data type propagation step is complete, the method shown in FIG. 1 proceeds with an architectural optimization step 24, in which parts of the design are assigned to parts of the field programmable gate array chip which will implement the design. In this architectural optimization step 24, the requirements of the design are matched with the vendor-specific architectural characteristics of the physical chip to make more efficient use of the resources (circuit elements) on the chip by optimization methods, such as those methods 113, 114, 115, 116, 117, 118 shown in step 24 by way of example.

Architectural Optimization Example

Figure 2:
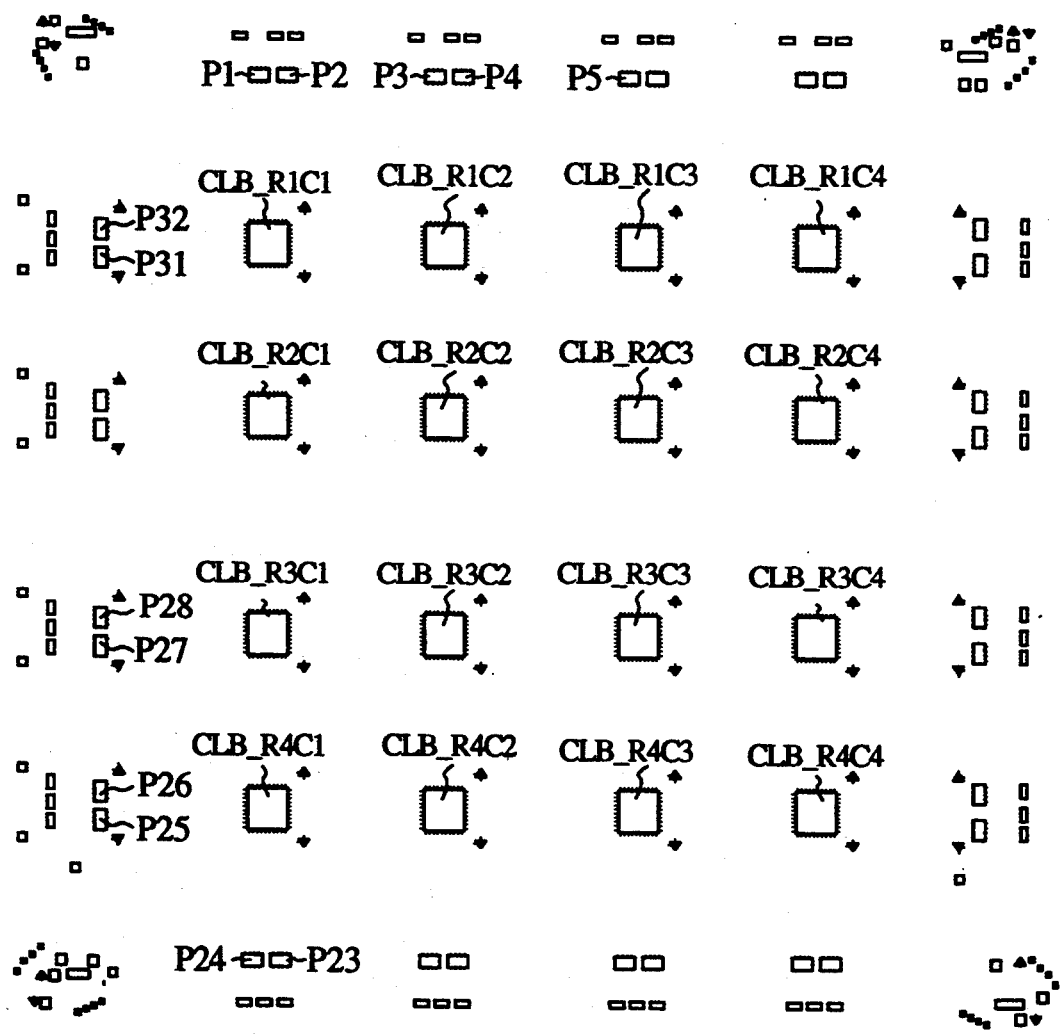
FIG. 2 shows an overview diagram of a field programmable logic array chip which is advantageously configured using the data type propagation method of the present invention.

FIG. 2 shows an overview of a sample (smaller than commercially available) Xilinx 4000-series field programmable logic array chip which can be advantageously programmed using the methods of the invention. Such chips are further described in the Xilinx Technical Data book entitled XC 4000 Logic Cell(TM) Array Family (c) 1990 by Xilinx, Inc., and available from Xilinx, Inc. 2100 Logic Drive, San Jose, 95124. This chip includes logic blocks CLB R1C1 through CLB R4C4 in the interior of the chip. At the perimeter of the chip are input/output (I/O) blocks P1 through P32 tied to external pins (not shown) of the chip.

Figure 3:
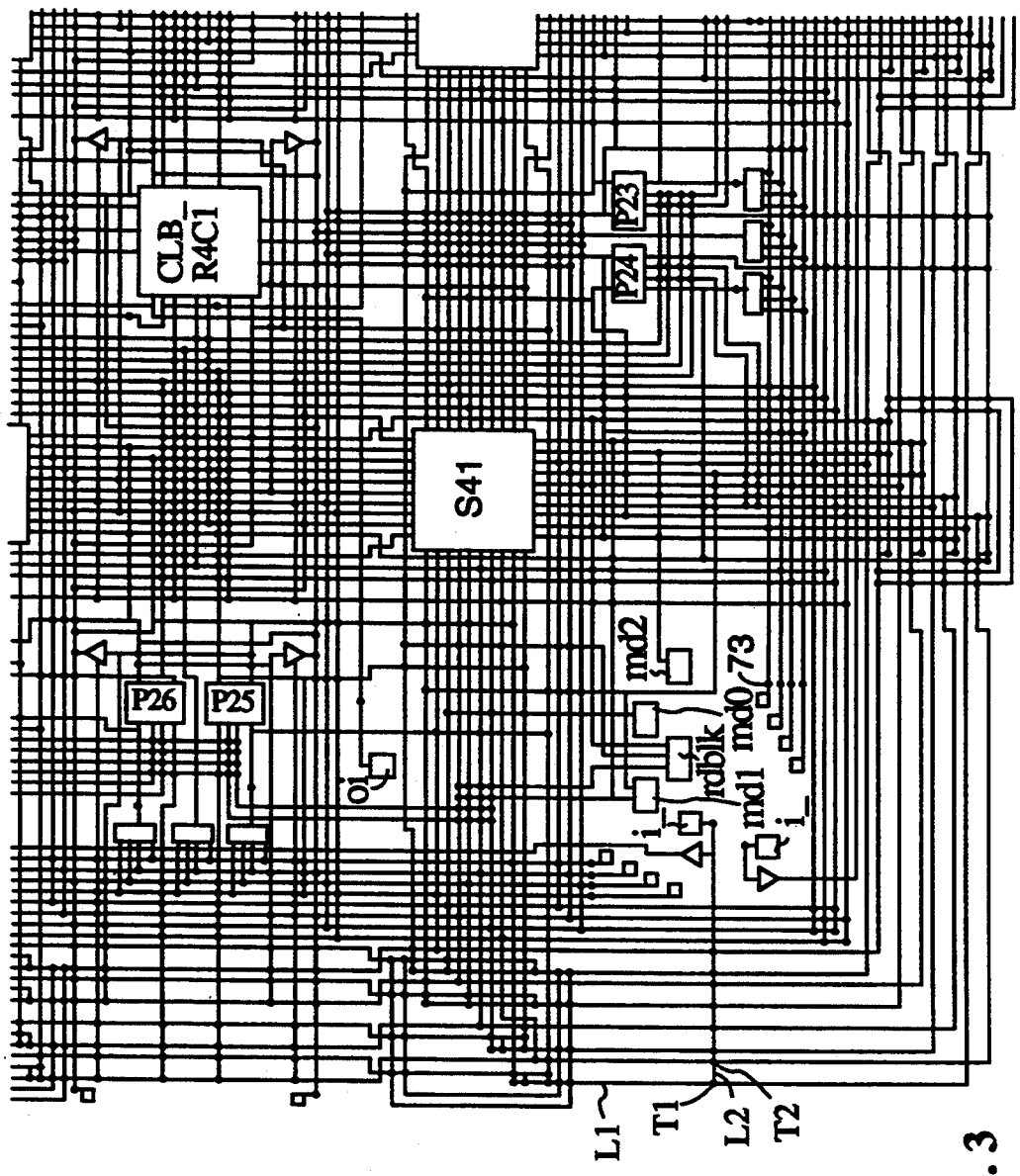
FIG. 3 shows in more detail one corner of the diagram of FIG. 2, and includes interconnect lines, interconnect elements, and switch boxes.
Figure 4:
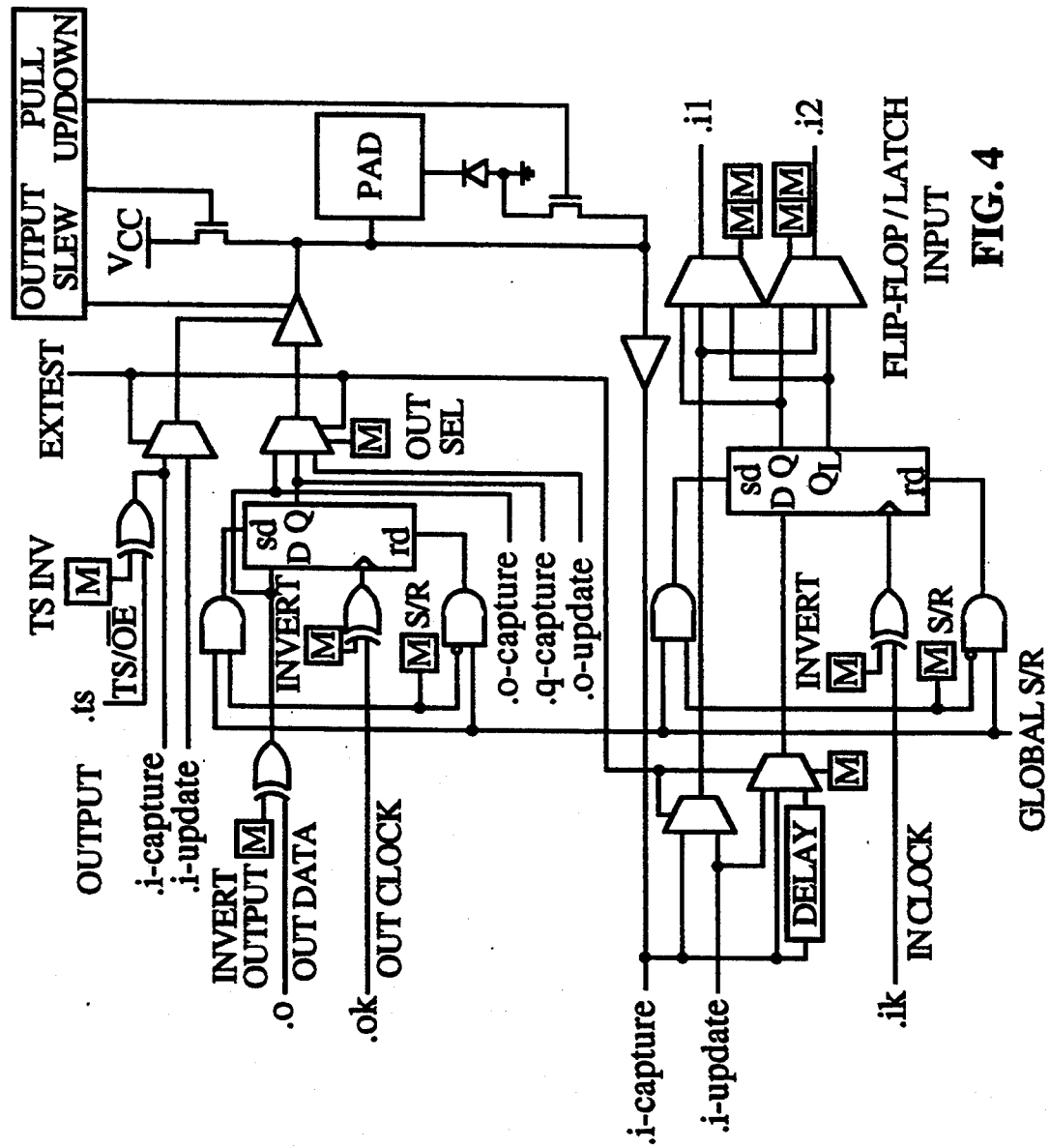
FIG. 4 shows in more detail an input/output block indicated by a box in FIGS. 2 and 3.
Figure 5:
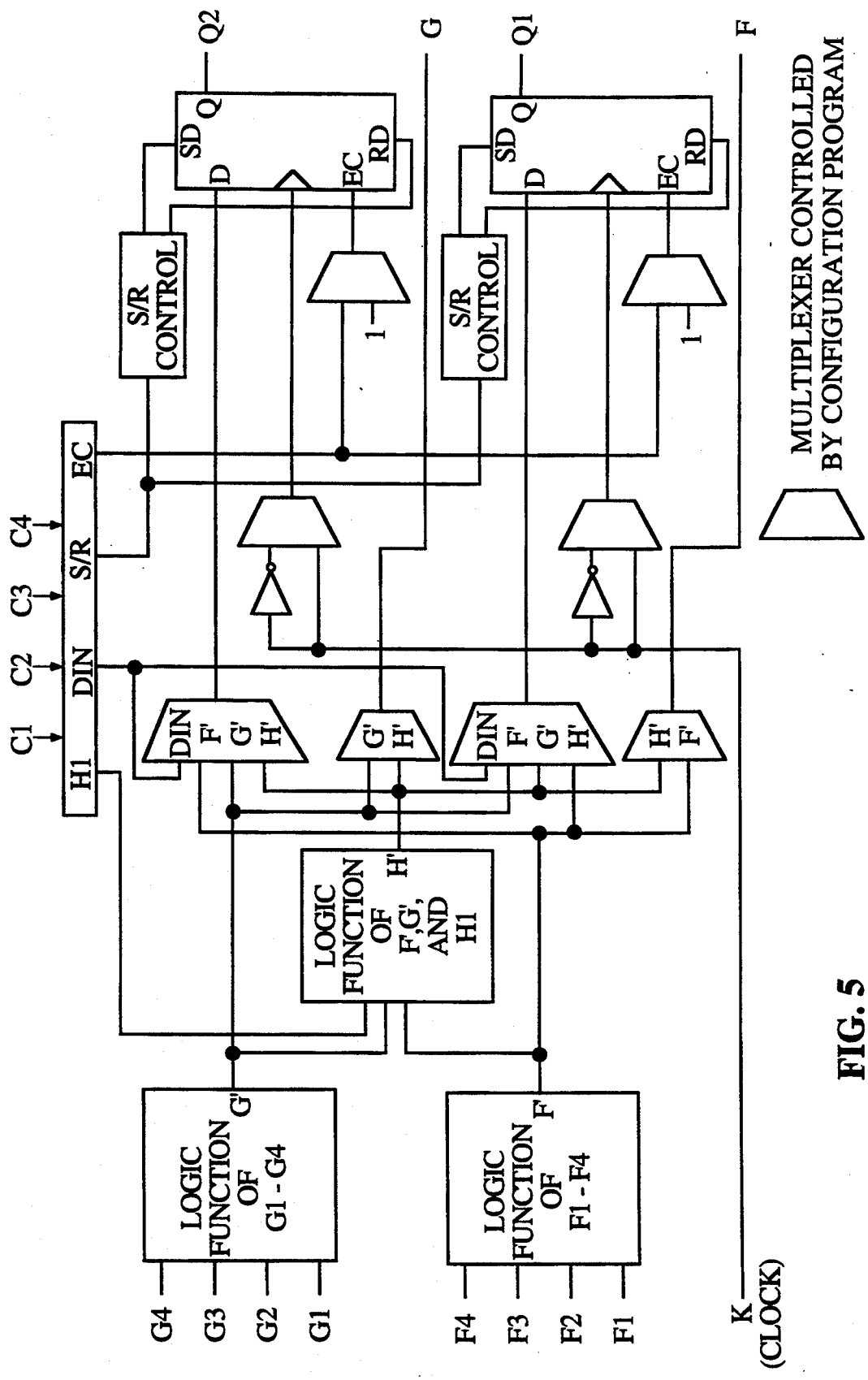
FIG. 5 shows in more detail a configurable logic block indicated by a box in FIGS. 2 and 3.
Figure 6:
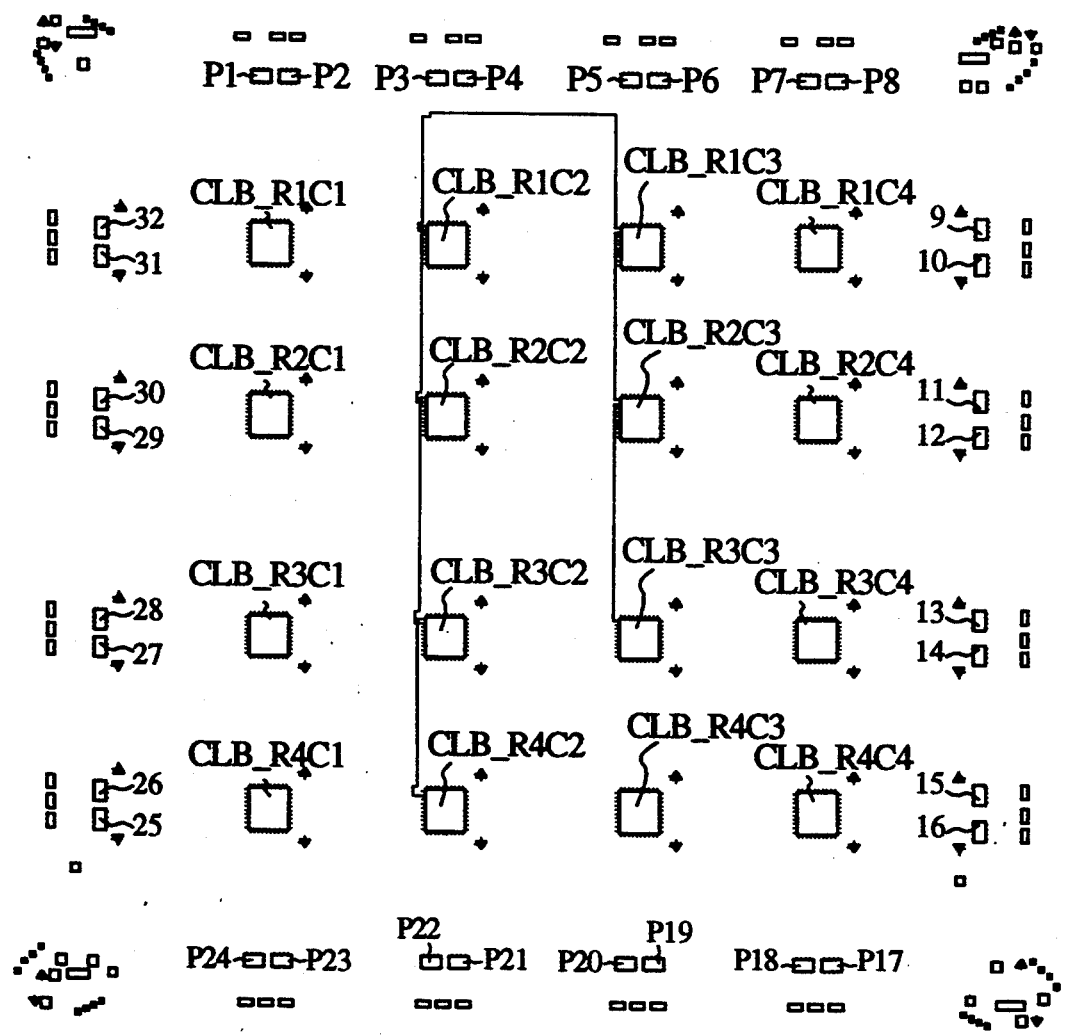
FIG. 6 shows the overview diagram of FIG. 2 including the fast carry interconnect lines available for implementing arithmetic functions using adjacent logic blocks.

FIG. 3 shows the lower left corner of the chip of FIG. 2, including CLB R4C1 and I/O blocks P23 through P26, as well as switch box S41 not shown in FIG. 2. (For further description of the switch boxes see U.S. Pat. No. 4,870,302.) Also shown in FIG. 3 are interconnect lines L1 and L2 and many other interconnect lines not labeled. Interconnecting many of these interconnect lines are pass transistors, of which pass transistors T1, T2 and T3 are labeled. I/O blocks P1 through P32 include bidirectional input/output buffers and sequential elements. CLBs C1R1 through R4C4 include combinatorial elements and include sequential elements as do the I/O blocks. FIGS. 4 and 5 show an I/O block and a CLB respectively. Also provided on the chip are several high drive low skew buffers for driving high fan-out signals such as global clock and reset signals. The chip includes interconnect lines of both short and long length, short for interconnecting nearby elements, and long for interconnecting elements in distant parts of the chip or for interconnecting multiple elements. The Xilinx 4000-series chips include a fast carry function (see Hsieh, U.S. patent application Ser. No. 07/522,336 for a detailed description. This patent application is incorporated by reference.) This fast carry function allows arithmetic functions which are placed in adjacent CLBs as shown in FIG. 6, to be implemented in a small area and to perform computations very fast.

It is preferable to place the designer's logic circuitry in portions of the chip which allow the overall design to be implemented most efficiently. For example, if the designer has called for a register with a clock input, and the register will connect to an external pin, this register is preferably assigned to one of the I/O blocks rather than to an internal logic block, thus leaving the internal logic blocks for handling more complex logic.

In the architectural optimization step 24, the clock and high fan-out signals are assigned to one of the high-drive low-skew buffers and to one of the global lines on the chip. If present, a master reset signal is assigned to the global set/reset function. Arithmetic functions, especially wide arithmetic functions are mapped to use the fast-carry feature.

It is to be understood that also non-programmable chips and circuits may be designed and fabricated in accordance with the invention.

Module Generator

Before logic functions represented in the designer's block diagram can be placed in the logic array chip, the logic functions indicated in block diagram form are expanded to their full width in step 26 of FIG. 1 in a module generation step. A function designed as an adder, for example, with a 16-bit input bus is replaced by 16 1-bit adders with carry functions interconnected to form the 16-bit adder U.S. patent application Ser. No. 07/785,659, filed concurrently herewith describes this portion (step 26) Of the system in detail. Arithmetic functions are expanded using a style called "hard macros" (functions which have been optimized with particular circuit layouts for the particular hardware) to occupy a portion of the logic array chip (or several chips), and in their expanded format are recorded as a net list in an XNF (net list) file.

In the present preferred embodiment, there are about 30 module master templates for 30 high level functional components and additional master templates for other lower level functional components. Each functional component has ports, for example input ports, output ports, select ports, a carry-in port, etc. The module master template stores relationships (rules) between data types and precision (bus widths) for buses connected to certain ports of the particular functional component, and allowable data types for the ports. The functional components of the preferred embodiment include:

adder/subtracter
accumulator
up/down counter
data register
shift register
SRAM
PROM
comparator
input buffer
output buffer
bidirectional input/output buffer
three-state buffer
bus interface
bus inversions (inverter)
place a value on a bus
multiplexers
bus-wide AND
OR
NAND
NOR
XOR
XNOR The bus-wide Boolean functions can be implemented in the following manner:
    AND/OR/XOR all of the bits of the bus together and provide a single bit output, for example XOR all the inputs to a bus to build an even parity generator.
    AND/OR/XOR bits from one bus with corresponding bits from a second bus to provide a bus-wide output. AND/OR/XOR each bit of a bus with a single bit input to provide a bus-wide output. The single bit is usually an enable signal or an inverter.

Similarly, the bus-wide multiplexer can be implemented in the following ways:
    to provide-a single bit output by selecting a single one of the inputs, or
    to provide a bus-wide output by selecting one of a plurality of buses connected to the inputs.

After completion of module generation in step 26 of FIG. 1, in step 28 further architecture optimization is performed as shown in step 151, followed by writing of the system output (a netlist) in step 30, from which the circuit is programmed or laid out and fabricated.

A data type propagation process according to the invention is described in detail below. In a preferred embodiment, the process is a computer program in the Quintus Prolog language, commercially available from Quintus corp.

When the designer generates the logic design, he specifies functional components from the library of functional components, and how they connect to other functional components and to input and output pins. For each functional component which will be used in the logic design, the master template of that functional component must be located in the library. The designer will also associate some information on data type and precision with some of the functional components in the logic design. As an important feature of the present invention, it is not necessary for the designer to specify data type and precision for every bus and every port of every functional component. The process of the present invention relieves the designer of this tedious activity.

Data Type Propagation Program

The process for data type propagation is as follows:
1. Associate module and component architecture port data types with the port on the module instances.
2. Convert data type information on certain module instances to the internal data type format and associate this information with the proper ports.
3. Propagate the known port data types to the signals to which they attach.
4. Propagate the known signal or bus data types to the ports to which they attach.
5. Propagate the information on one or more ports of a component or module instance to the other ports on the component or module instance.
6. Repeat steps 3–5 until no more data type information can be propagated.

Steps 3–6 are made more efficient as follows:
1. The ports are divided into three sets:
(A) Ports without data type information,
(B) Ports with data type information which have not yet been processed, and
(C) Ports with data type information which have been processed.
The ports are initially in either set 1A or 1B.
2. The signals (busses) are divided into two sets:
(A) Signals (busses) without data type information,
(B) Signals (busses) with data type information.
The signals (busses) are all initially in either set 2A or 2B.
3. For each port in set 1B,
(a) Pick a port P, in set 1B.
(b) Find the signal, S, (if any) attached to port P.
(c) If signal S is an element of set 2A (i.e., does not have a data type), associate P is data-type with signal S, then move S from set 2A to set 2B.
(d) Move the port from set 1B into set 1C.
(e) Find all ports, PS, connected to signal S.
(f) Associate signal S's type with all ports that one members of set 1A, and move those ports which were in set 1A into set 1B.
(g) For each of these ports, find all related ports on the same component instance according to the master template rules. These rules indicate which ports on a component instance are related to one another and what form of data type on one port corresponds to other data types on the other ports. When the data type on a related port on the component instance can be determined according to the master template rules, move any such newly-type-defined ports from set 1A into set 1B.

4. Repeat steps 3a–3g until set 1B is empty.

5. Further user input is provided if necessary in response to error messages.

Note that this procedure is guaranteed to terminate, as a port is always removed from set 1B on each iteration. Set 1B gets new elements from set 1A, but set 1A only decreases in size as its ports acquire data types. In the worst case, the number of iterations=the total number of ports= |set 1A| + |set 1B|.

Also, steps 3(c), 3(e), 3(f), and 3(g) each include a verification step in which the program makes sure that the associated data type is compatible with any previously associated data type for the particular port or signal. If compatibility is not found, an error message issues.

This description is illustrative and not limiting; other modifications will be apparent to one skilled in the art in the light of this disclosure.

We claim:

1. In a computer process a method for propagating information associated with a logic design, said logic design including a plurality of functional components interconnected with a plurality of buses, said method comprising the steps of:
   providing a template for each functional component, wherein said template includes rules controlling propagation of predetermined parameters through the functional component and between interconnected functional components;
   entering at least one of said predetermined parameters at a selected location in said logic design; and
   propagating said at least one parameter to another functional component or bus in said logic design in accordance with said rules.

2. The method of claim 1 wherein said functional components includes a plurality of ports and further wherein said step of propagating said at least one parameter comprises the step of:
   propagating said at least one parameter associated with one port of one component to another port of said one component according to said rules.

3. The method of claim 2 wherein said step of propagating said at least one parameter comprises dividing said plurality of ports of said one component into three sets:
   ports without parameter information,
   ports with parameter information which has not been propagated to other ports or buses, and
   ports with parameter information which has been propagated to other ports and buses.

4. The method of claim 3 further including the step of moving said ports with parameter information which heretofore had not been propagated to said set of ports with parameter information which has been propagated.

5. The method of claim 1 wherein said step of propagating said at least one parameter comprises the step of propagating said at least one parameter from a port of one functional component to one bus of said plurality of buses, said one bus being connected to said port.

6. The method of claim 3 wherein said step of propagating said at least one parameter comprises the step of propagating said at least one parameter from one of said plurality of buses to a port of one of said plurality of functional components connected to said one bus.

7. The method of claim 6 wherein said step of propagating said at least one parameter from one of said plurality of buses to a port of one of said plurality of functional components connected to said one bus further comprises the step of adding said port to said set of ports with parameter information which has not been propagated to other ports of said module.

8. The method of claim 6 wherein said step of propagating said at least one parameter from one of said plurality of buses to a port of one of said plurality of functional components connected to said one bus further comprises the step of checking said at least one parameter of said one bus with a previously-associated parameter of said one port.

9. The method of claim 1 further comprising the step of checking said at least one parameter against a plurality of master parameters specified in said rules.

10. The method of claim 1 further comprising the step of issuing a message requesting additional parameters to characterize said logic design.

11. In a computer process, a method for checking information in a logic design, said logic design including a plurality of modules interconnected by buses, said method comprising the steps of:
    providing rules for each type of module; and
    checking user-specified parameters for said logic design against allowed parameters specified in said rules for each type of module.

12. The method of claim 11 wherein each module includes at least one input port or at least one output port, and wherein said allowed parameters specify a data type of said at least one input port or said at least one output port of each module in said logic design.

13. The method of claim 12 wherein said data type determines the mode of operation of said plurality of modules.

14. The method of claim 11 wherein each module includes at least one input port or at least one output port, and wherein said information further comprises a precision of said at least one input port or said at least one output port of each module in said logic design.

15. The method of claim 12 wherein said precision determines the mode of operation of said plurality of modules.

16. In a computer-implemented method for checking information associated with a logic design, said logic design including a plurality of modules interconnected by buses, said method comprising the steps of:
    providing rules for each type of module; and
    checking propagated parameters associated with said logic design against allowed parameters specified in said rules for each type of module.

17. The method of claim 16 wherein said step of checking includes the step of comparing and determining the validity of a port on a module using said rules for that type of module, 18. The method of claim 16 further including the step checking derived parameters associated with said logic design against allowed parameters specified in said rules for each type of module.

* * * * *

UNITED STATES PATENT AND TRADEMARK OFFICE
CERTIFICATE OF CORRECTION

PATENT NO. : 5,422,833

DATED : June 6, 1995

INVENTOR(S) : Steven H. Kelem and Steven K. Knapp

It is certified that error appears in the above-identified patent and that said Letters Patent is hereby corrected as shown below:

In the Abstract, line 6, "desires," should read --desires.--.

In the Abstract, line 8, "consistency," should read --consistency.--.

In the Abstract, line 10, "consistency," should read --consistency--.

Col. 2, line 5, "portion the" should read --portion of the--.

Col. 7, line 5, "Of" should read --of--.

Col. 7, line 60, "provide-a" should read --provide a--.

Col. 8, line 5, "corp." should read --Corp.--.

UNITED STATES PATENT AND TRADEMARK OFFICE
CERTIFICATE OF CORRECTION

PATENT NO. : 5,422,833   Page 2 of 2
DATED : June 6, 1995
INVENTOR(S) : Steven H. Kelem and Steven K. Knapp It is certified that error appears in the above-indentified patent and that said Letters Patent is hereby corrected as shown below:

Claim 1, col. 9, line 22, "process a" should read --process, a--.

Signed and Sealed this

Fifth Day of December, 1995

Attest:

BRUCE LEHMAN

Attesting Officer   Commissioner of Patents and Trademarks